(12) United States Patent
Bradley et al.

(10) Patent No.: US 8,276,460 B2
(45) Date of Patent: Oct. 2, 2012

(54) PACKAGING FOR CHIP-ON-BOARD PRESSURE SENSOR

(75) Inventors: Alistair D. Bradley, Dublin, OH (US); Lamar F. Ricks, Lewis Center, OH (US)

(73) Assignee: Honeywell International Inc., Morristown, NM (US)

( * ) Notice: Subject to any disclaimer, the term of this patent is extended or adjusted under 35 U.S.C. 154(b) by 48 days.

(21) Appl. No.: 12/910,729

(22) Filed: Oct. 22, 2010

(65) Prior Publication Data

US 2011/0036176 A1 Feb. 17, 2011

Related U.S. Application Data

(63) Continuation of application No. 11/724,402, filed on Mar. 14, 2007, now abandoned.

(51) Int. Cl.
*G01L 7/00* (2006.01)
(52) U.S. Cl. ................ 73/756; 73/754; 73/706
(58) Field of Classification Search .......... 73/700–756
See application file for complete search history.

(56) References Cited

U.S. PATENT DOCUMENTS

| 4,680,569 | A | | 7/1987 | Yamaki et al. | |
|---|---|---|---|---|---|
| 5,285,690 | A | | 2/1994 | Koen et al. | |
| 5,454,270 | A | * | 10/1995 | Brown et al. | 73/720 |
| 5,465,626 | A | * | 11/1995 | Brown et al. | 73/715 |
| 5,695,590 | A | | 12/1997 | Willcox et al. | |
| 6,214,634 | B1 | * | 4/2001 | Osajda et al. | 438/50 |
| 6,516,513 | B2 | | 2/2003 | Milkovich et al. | |
| 6,768,196 | B2 | | 7/2004 | Harney et al. | |
| 6,769,319 | B2 | | 8/2004 | McDonald et al. | |
| 6,946,742 | B2 | | 9/2005 | Karpman | |
| 7,082,835 | B2 | | 8/2006 | Cook et al. | |
| 7,086,290 | B2 | | 8/2006 | Parker et al. | |
| 7,100,453 | B2 | | 9/2006 | Wang et al. | |
| 7,401,525 | B2 | | 7/2008 | Cobianu et al. | |
| 2002/0029639 | A1 | * | 3/2002 | Wagner et al. | 73/756 |
| 2003/0150275 | A1 | * | 8/2003 | Wagner et al. | 73/715 |
| 2006/0059994 | A1 | | 3/2006 | Cameron et al. | |
| 2008/0222884 | A1 | | 9/2008 | Bradley et al. | |
| 2008/0251866 | A1 | | 10/2008 | Belt et al. | |

OTHER PUBLICATIONS

Invensys, "19C, 19U & 19 Vacuum Gauge Series, Low Cost, Stainless Steel Isolated Pressure Sensors," 2 pages, prior to Oct. 20, 2009.

* cited by examiner

*Primary Examiner* — Andre Allen
(74) *Attorney, Agent, or Firm* — Seager Tufte & Wickhem LLC

(57) ABSTRACT

A method of packaging for chip-on-board pressure sensor that includes a buffer layer with a coefficient of thermal expansion (CTE) intermediate between the transducer and a main chip-on-board substrate by which thermally induced package stresses can be greatly reduced or eliminated. Additionally, the use of a buffer layer with higher stiffness (elastic modulus) than the chip-on-board substrate further prevents or reduces flexural (bending) stresses from being transferred to the transducer. Such a buffer layer also enables a wider choice of materials for bonding and stable performance of pressure sensor in harsh media and environmental conditions. The pressure transducer can be adhesively bonded to a ceramic layer, which in turn can be adhesively bonded to an epoxy laminate chip-on-board substrate.

20 Claims, 4 Drawing Sheets

PACKAGING FOR CHIP-ON-BOARD PRESSURE SENSOR

This application is a continuation of co-pending U.S. patent application Ser. No. 11/724,402, filed Mar. 14, 2007, and entitled "Packaging For Chip-On-Board Pressure Sensor", which is incorporated herein by reference.

TECHNICAL FIELD

Embodiments are generally related to pressure sensors and transducers. Embodiments are also related to Chip-on-Board components and configurations. Embodiments are additionally related to chip-on-board pressure sensor packages.

BACKGROUND OF THE INVENTION

Many processes and devices have been used in the field of pressure sensing. Pressure sensors are generally used and deployed wherever a need for monitoring and responding to pressure changes is necessary. Pressure sensors are commonly used in a variety of automotive, aerospace, commercial, industrial, and consumer applications.

The operational environments in which pressure sensors are required to operate in these applications with high accuracy and repeatability can be very demanding. For example, extreme thermal conditions including thermal shocks in ranges from 160 C to −55 C, exposure to harsh and/or conductive media, withstand high overpressure (proof pressure) cycling without change in calibration and survive high peak (burst) pressures to protect system from potentially catastrophic leaks.

In the case of a pressure sensor that relies upon the use of a pressure transducer (or sense element) consisting of piezoresistive silicon on an etched silicon diaphragm a most cost effective solution for operating in such environments is to use so called "back-side" sensing. With this arrangement the only parts of sensor which are exposed to the media are the electrically isolated cavity side of the pressure transducer, the adhesive used to bond the transducer die to a substrate and finally the substrate itself.

FIG. 1 illustrates a cross sectional view of a prior art direct chip-on-board mounted pressure sensor apparatus 100. The configuration illustrated in FIG. 1 generally includes a pressure transducer/die 102 that is attached to a printed circuit board (PCB) substrate 106 with the assistance of a die-attach adhesive 104. The bottom portion of the pressure sensor apparatus 100 includes a housing 108. A top cover 105 or protective portion is also included. The configuration depicted in FIG. 1 is generally presented for background and edification purposes only and is not considered a limiting feature of the disclosed embodiments.

For such a design to operate reliably under the conditions described above typically requires the use of attach materials which have high strength and chemical resistance. The rigid mounting of stress sensitive die (e.g., pressure transducer or pressure sense element) onto a substrate where there is large mismatch in thermal expansion coefficient between the die and the substrate can introduce high levels of package stress, which can result in output errors, non-repeatability and potentially, mechanical damage.

Pressure sensor apparatus 100 depicted in FIG. 1 is an example of a device in which a large mismatch in the thermal expansion coefficient between the die and substrate can exist. Also under extreme operating conditions stress can be transferred into the substrate from outer packaging such as encapsulation. These stresses can be transferred into the die attach adhesive and the pressure transducer itself. The resulting high levels of stress at or near the pressure transducer can cause non-repeatability errors due to effects such as creep, larger thermal errors (for example temperature coefficient of offset) and even destructive levels of mechanical stress. It is therefore believed that a solution to these problems lies in the implementation of an improved pressure sensors method and apparatus, which is disclosed in greater detail herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved pressure sensor.

It is another aspect of the present invention to provide for a pressure sensor configuration that includes a mounting of a stress-sensitive die onto a substrate.

It is a further aspect of the present invention to provide for an improved package for a chip-on-board pressure sensor.

The aforementioned aspects and other objectives and advantages can now be achieved as described herein. A packaging method and apparatus for a chip-on-board pressure sensor is disclosed. A chip-on-board substrate can be provided and a pressure transducer connected to the chip-on-board substrate. A buffer layer is generally located between the pressure transducer and the chip-on-board substrate in order to form a pressure sensor in which thermally induced package stresses are prevented or reduced from being transferred to the pressure transducer.

In general, such a buffer layer requires a coefficient of thermal expansion (CTE) intermediate between the pressure transducer and the chip-on-board substrate. Additionally a high stiffness (i.e., elastic modulus) of the buffer layer prevents or reduces flexural (e.g., bending) stresses from being transferred to the pressure transducer. In a preferred embodiment, buffer layer such a ceramic can be adhesively bonded to pressure transducer which in turn can be adhesively bonded to the main chip-on-board substrate. Importantly the proposed buffer layer also allows greater flexibility in adhesive selection and/or bonding methods when compared with direct chip-on-board mounting methods and devices, wherein several technical trade-offs have to be made to reliably attach the pressure transducer.

The chip-on-board substrate typically carries the electrical circuitry and/or other die components and/or mechanical features for protection of components. In alternative embodiments, additional components and/or circuitry and/or mechanical features may be incorporated directly into the buffer layer.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
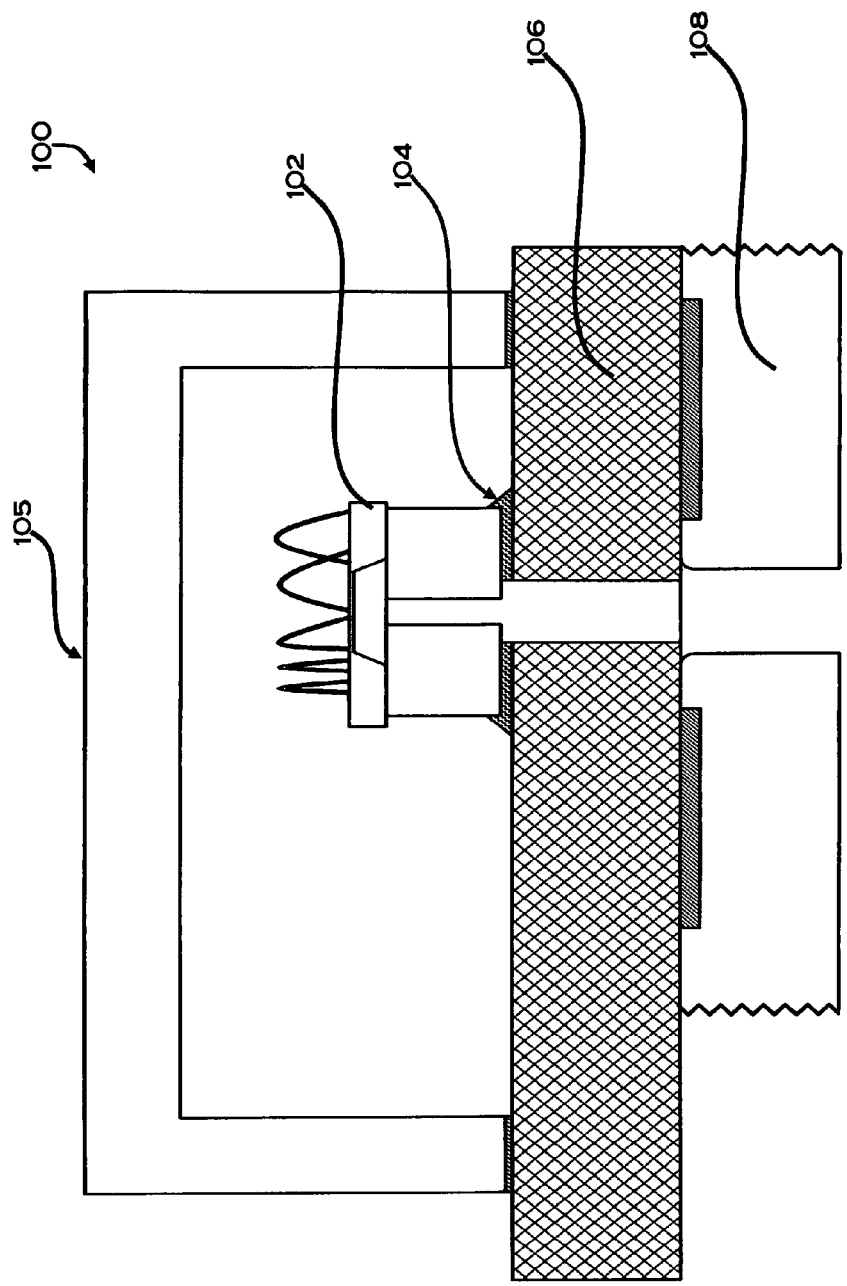
FIG. 1 illustrates a cross sectional-view of a prior art direct chip-on-board mounting method and system.
Figure 2:
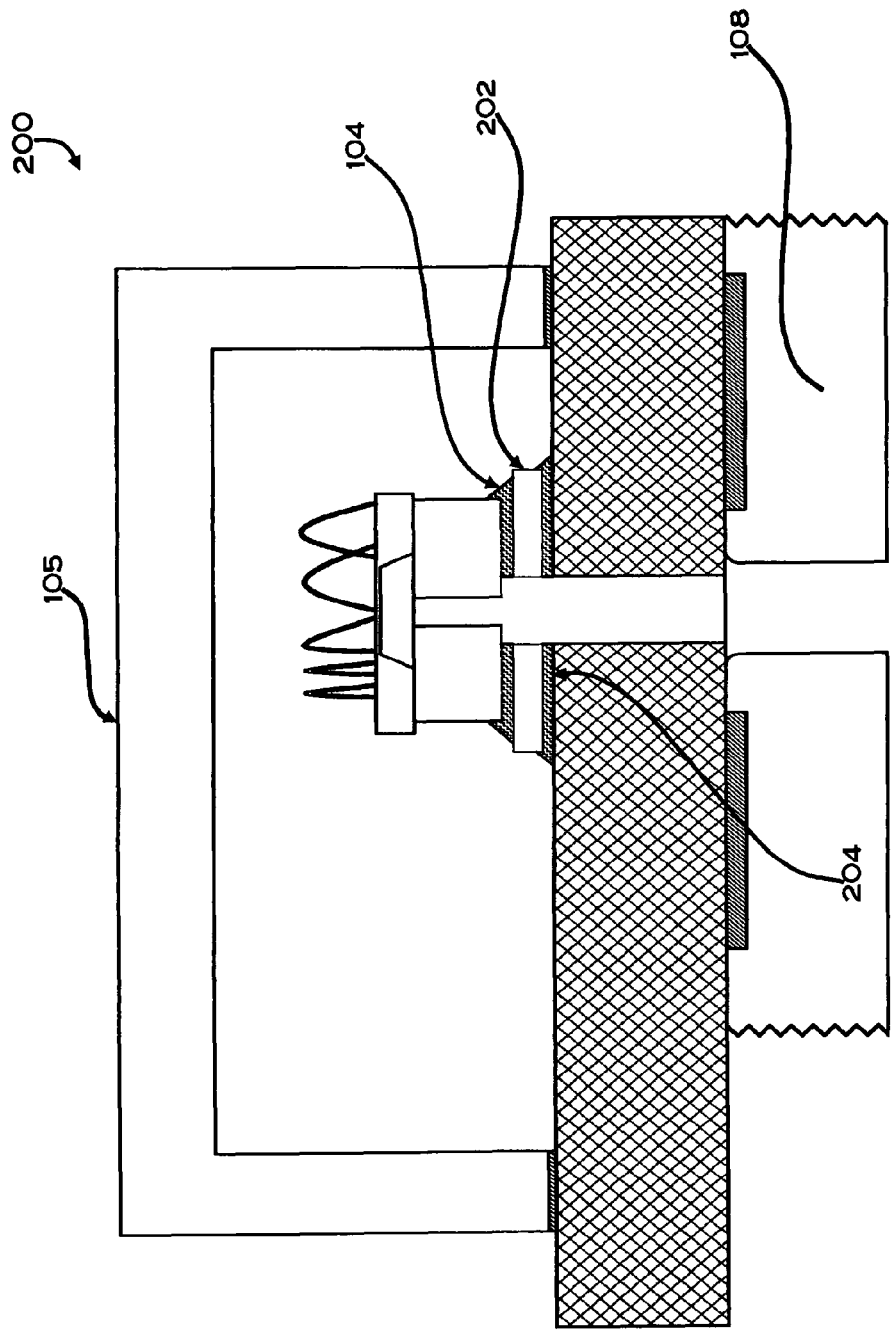
FIG. 2 illustrates a cross-sectional view of a ceramic buffer layer for chip-on-board mounting utilized in packaging for chip-on-board pressure sensor, in accordance with a preferred embodiment.

Referring now to the drawings and in particular to FIG. 2, a cross-sectional view of a ceramic buffer layer for chip-on-board mounting for packaging a chip-on-board pressure sensor apparatus 200 is illustrated, in accordance with a preferred embodiment. Note that in FIGS. 1-2, identical or similar parts or elements are generally indicated by identical reference numerals. It can be appreciated, however, that the apparatus 200 differs from that of the apparatus 100 depicted in FIG. 1. Apparatus 200 and apparatus 100 are discussed with respect to one another in order to contrast the differences and improvements of Applicant's improved embodiments. The pressure sensor apparatus 200 depicted in FIG. 2 generally includes a pressure transducer 102 (e.g., sensor die) that is attached to a printed circuit board (PCB) substrate 106 by means of an adhesive 104.

The ceramic buffer layer 202 can be bonded to the pressure transducer 102 by an adhesive 204 which in turn is adhesively bonded to a main chip-on-board substrate 106 (such as the substrate disclosed in the configuration of FIG. 1), which can comprise, for example, an FR4 epoxy laminate.

The typical CTE (coefficient of thermal expansion) of a PCB (printed circuit board) laminate in an x-y plane is typically 14 ppm/C (parts per million/C) at 25° C. The pressure transducer 102 shown in FIG. 1 generally includes silicon (typical CTE 2.6 ppm/C at 25° C.) that is anodically bonded to glass layer (typical CTE 3.3 ppm/K at 25° C.). Note that the components 106 and 102 depicted in FIG. 1, although not specifically identified in FIG. 2, can be incorporated into the configuration of FIG. 2. Such components are not specifically identified in the illustration of FIG. 2 in order to focus the reader's attention on the different and improved components and configuration of apparatus 200.

Advantageously, the CTE of the ceramic layer 202 such as Alumina 96% Al2O3 is typically 6 ppm/K at 25° C. which is intermediate between that of the transducer and the substrate. Therefore, the level of differential thermal expansion between the die and its point of attachment is greatly reduced by the presence of the buffer layer. Furthermore the elastic modulus of ceramic is typically 300 GPa, which can be considered to provide sufficient stiffness to prevent flexure stresses from the chip-on-board substrate and external packaging from transferring to the pressure transducer.

Figure 3:
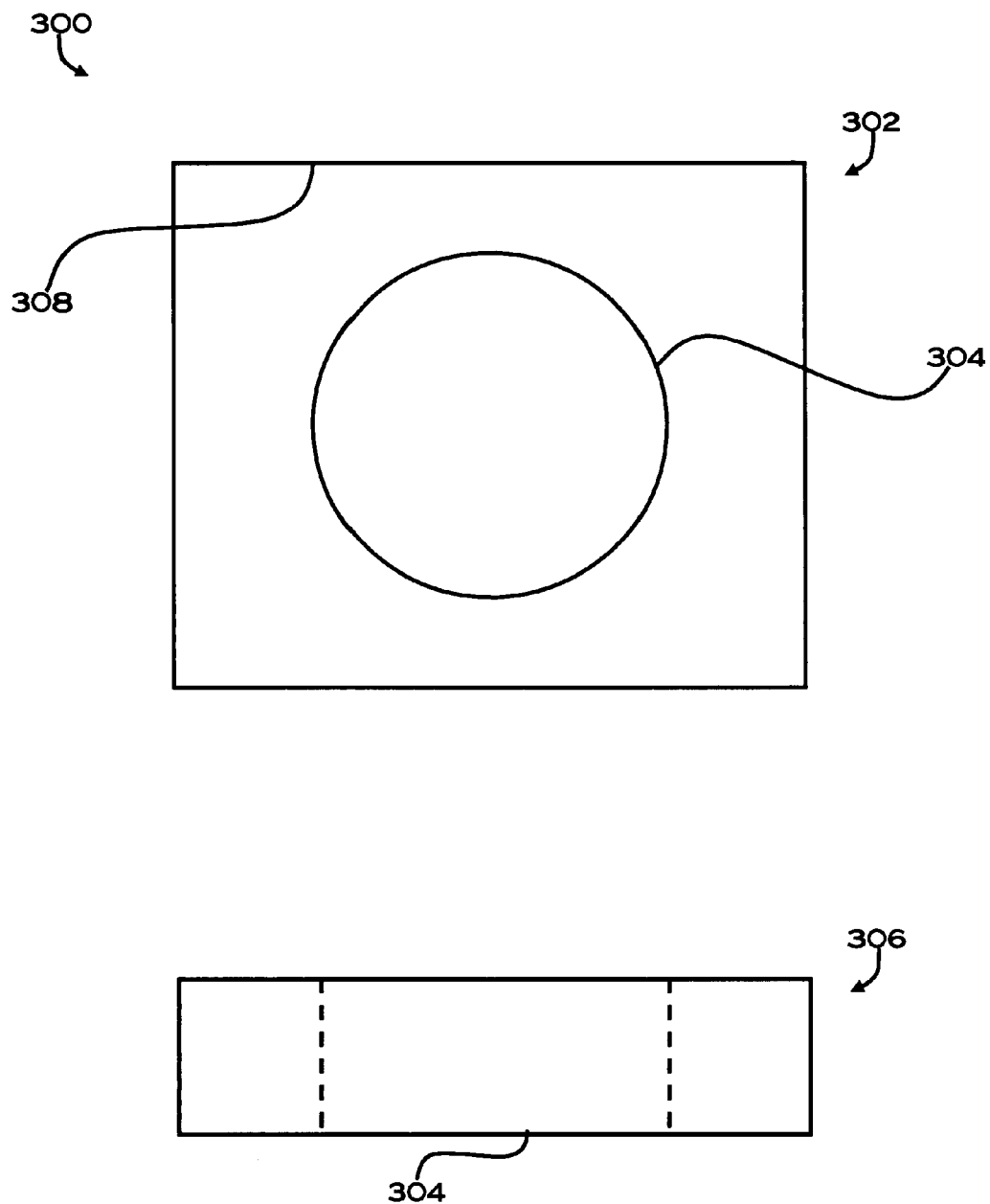
FIG. 3 illustrates views of a ceramic buffer layer adapted for use with a chip-on-board pressure sensor, in accordance with a preferred embodiment.

FIG. 3 illustrates views of such a ceramic buffer layer component for a chip-on-board pressure sensor 300, which can be implemented in accordance with a preferred embodiment. A plan view of ceramic buffer layer 302 is with length/breadth 3 mm 308. A side view of ceramic buffer layer 306 generally includes a through-hole 304 for pressure inlet as indicated in FIG. 3.

Figure 4:
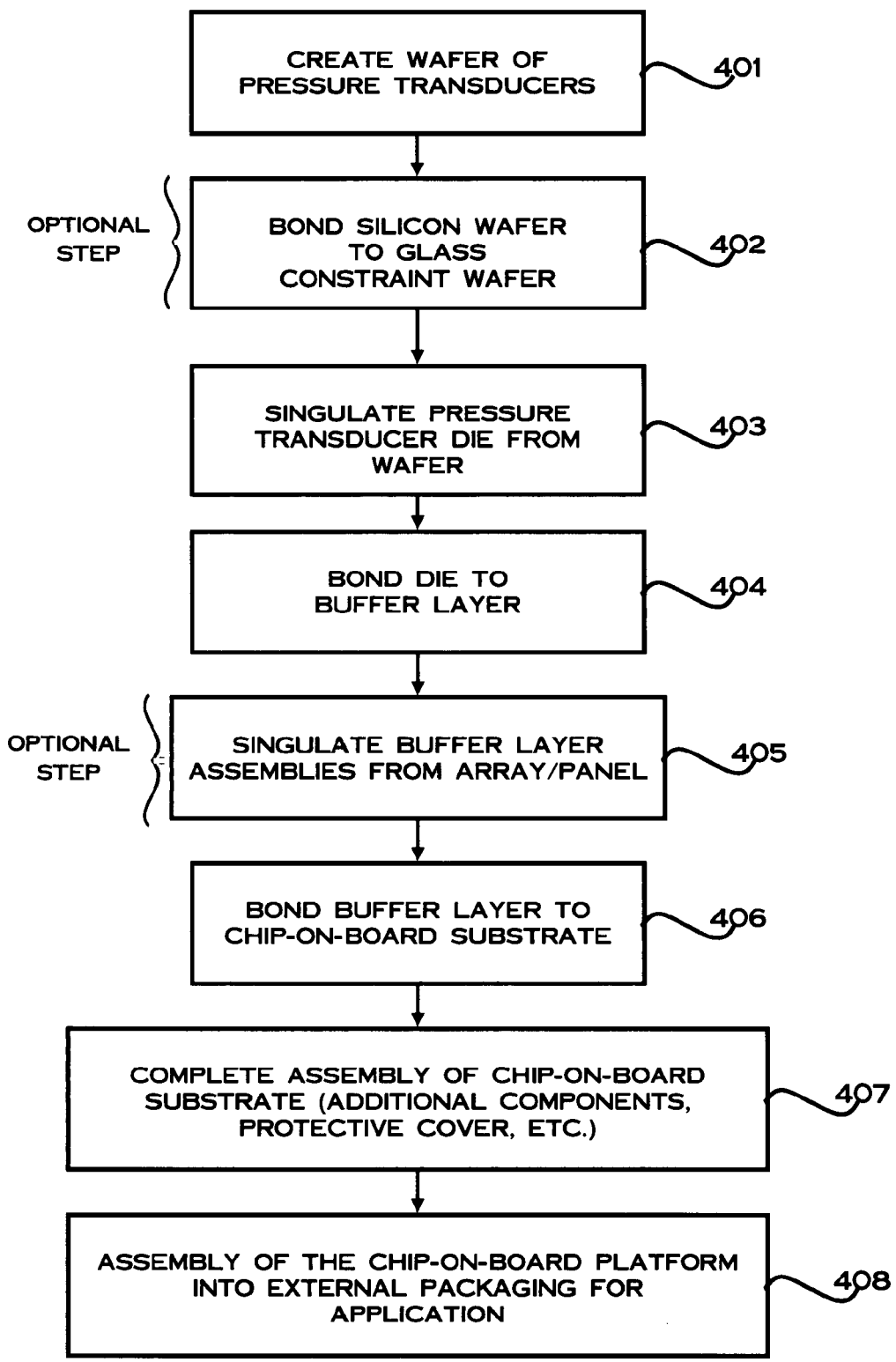
FIG. 4 illustrates a high-level flow chart of operations depicting logical operational steps of a method for implementing a ceramic buffer layer for chip-on-board mounting with packaging for a chip-on-board pressure sensor, in accordance with a preferred embodiment.

FIG. 4 illustrates a high-level flow chart of operations depicting a method 400 for enabling a chip-on-board assembly for a pressure sensor, in accordance with a preferred embodiment. As indicated at block 401, a wafer of one or more pressure transducers can be created. Next, as depicted at block 402, an optional operation can be implemented in which the wafer (silicon) is bonded to glass in order to constrain the wafer. Thereafter as illustrated at block 403, an operation can be processed in order to singulated the pressure transducer die from the wafer. Next as depicted at block 404, the die can be bonded to the buffer layer described previously. Thereafter, as depicted at block 405, an optional step can be processed in order to singulated the buffer layer assemblies from the array/panel. The buffer layer can then be bonded to the chip-on-board substrate as indicated at block 406 and the pressure transducer then wire-bonded to the chip-on-board substrate. Thereafter, as indicated at block 407, the assembly of the chip-on-board substrate (additional components, protective cover etc) can be completed, following thereafter by the operation depicted at block 408 involving assembly of the chip-on-board platform into external packaging for applications.

One possible fabrication process for implementing the method 400 depicted in FIG. 4 can be summarized generally as follows:

Step 1: Create wafer of pressure transducers
Step 2: Optional: Bond Silicon wafer to glass constraint wafer
Step 3: Singulate pressure transducer die from wafer
Step 4: Bond die to buffer layer
Step 5: Optional: Singulate buffer layer assemblies from array/panel
Step 5: Bond buffer layer to chip-on-board substrate
Step 6: Wire bond pressure transducer to chip-on-board substrate
Step 7: Complete assembly of chip-on-board substrate (additional components, protective cover etc).
Step 8: Assembly of the chip-on-board platform into external packaging for application.

Note that in an alternative embodiment as described with respect to Step 2(i.e., also see block 402) above, a pressure transducer can be provided without the additional anodically bonded glass layer. Also as indicated by Step 5 (i.e., also see block 405) above, the manufacturing and handling of multiple buffer layer structures in an array (i.e., batch) form can be achieved. In another alternative embodiment, the use of material other than ceramic such as metal or plastic, but having a CTE intermediate between that of the transducer and the chip-on-board substrate and a higher elastic modulus than the substrate can be used. Additionally, Step 6, although not specifically shown in FIG. 4 can be implemented in accordance with the general methodology of method 400. It can be appreciated that variations to method 400 can be implemented in accordance with alternative embodiments while still remaining within spirit and scope of method 400.

In yet another embodiment a buffer layer can be attached to the substrate using a eutectic metal solder. Additionally, this could be used to provide a pressure seal to the substrate or alternatively an electrical connection to the substrate with the addition of an insulating under-fill adhesive to complete the seal.

In another embodiment to enable additional electrical connections to the pressure transducer and/or chip-on-board substrate, electrical circuit traces, vias, and/or bond pads can be provided on the buffer layer. As further alternative embodiment involves implementing the buffer layer in a multilayer structure with a process such as high temperature co-fired, ceramic (HTCC) or low temperature co-fired ceramic (LTCC). Such features can also be used to enable additional mechanical features such as cavities for protection of the pressure transducer and/or buried channels for fluid path to back-side, and/or circuit traces to simplify design and assembly Based on the foregoing, it can be appreciated that the pressure sensor method and apparatus described herein therefore overcomes the aforementioned problems associated with the prior art by creating a compact packaging for a pressure sensor that includes chip-on-board assembly capabilities, which enables efficient and robust fabrication for various aerospace, automotive, industrial, consumer, commercial and other applications.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A chip-on-board pressure sensor apparatus, comprising:
a chip-on-board substrate defined by a first major surface and an opposing second major surface, the chip-on-board substrate having a through-hole extending from the first major surface of the chip-on-board substrate through to the second major surface of the chip-on-board substrate;
a pressure transducer, the pressure transducer having:
a pressure transducer die with a pressure transducer element;
a constraint defined by a first major surface and an opposing second major surface with a side wall extending between the first major surface and the second major surface, wherein the side wall of the constraint defines a perimeter of the constraint, the constraint further having a through-hole that extends from the first major surface through to the second major surface of the constraint;
the pressure transducer die bonded to the first major surface of the constraint, with the pressure transducer element of the pressure transducer die in registration with the through-hole of the constraint;
a ceramic buffer defined by a first major surface and an opposing second major surface with a side wall extending between the first major surface and the second major surface, wherein the side wall of the ceramic buffer defines a perimeter of the ceramic buffer, the ceramic buffer further having a through-hole that extends from the first major surface through to the second major surface of the ceramic buffer;
the ceramic buffer interposed between and bonded to the constraint of the pressure transducer and the chip-on-board substrate, with the through-hole of the ceramic buffer in fluid communication with the through-hole of the constraint, wherein the perimeter of the ceramic buffer extends out beyond the perimeter of the constraint, and the ceramic buffer is bonded to the chip-on-board substrate in the portion of the ceramic buffer that extends out beyond the perimeter of the constraint; and
wherein said ceramic buffer includes a coefficient of thermal expansion that is between that of said constraint and said chip-on-board substrate.

2. The chip-on-board pressure sensor apparatus of claim 1, wherein the through-hole of the chip-on-board substrate is aligned with the through-hole of the ceramic buffer.

3. The chip-on-board pressure sensor apparatus of claim 1, wherein the through-hole of the chip-on-board substrate is substantially co-axial with the through-hole of the ceramic buffer.

4. The chip-on-board pressure sensor apparatus of claim 1, wherein the first major surface of the ceramic buffer is bonded to the second major surface of the constraint.

5. The chip-on-board pressure sensor apparatus of claim 4, wherein the second major surface of the ceramic buffer is bonded to the first major surface of the chip-on-board substrate.

6. The chip-on-board pressure sensor apparatus of claim 5, wherein the pressure transducer is situated adjacent to the first major surface of the chip-on-board substrate.

7. The chip-on-board pressure sensor apparatus of claim 1, wherein the ceramic buffer is adhesively bonded to the constraint of the pressure transducer and adhesively bonded to the chip-on-board substrate.

8. The chip-on-board pressure sensor apparatus of claim 1, wherein the ceramic buffer is bonded to the chip-on-board substrate using an eutectic metal solder.

9. The chip-on-board pressure sensor apparatus of claim 1, wherein the constraint includes glass and the pressure transducer die includes silicon, and the pressure transducer die is anodically bonded to the first major surface of the constraint.

10. The chip-on-board pressure sensor apparatus of claim 1, wherein the ceramic buffer is a multilayer structure having a plurality of cavities or buried channels.

11. A chip-on-board pressure sensor apparatus, comprising:
a chip-on-board substrate defined by a first major surface and an opposing second major surface;
a pressure transducer, the pressure transducer having:
a pressure transducer die with a pressure transducer element;
a constraint defined by a first major surface and an opposing second major surface with a side wall extending between the first major surface and the second major surface, wherein the side wall of the constraint defines a perimeter of the constraint;
the pressure transducer die bonded to the first major surface of the constraint;
a ceramic buffer defined by a first major surface and an opposing second major surface with a side wall extending between the first major surface and the second major surface, wherein the side wall of the ceramic buffer defines a perimeter of the ceramic buffer;
the ceramic buffer interposed between and bonded to the constraint of the pressure transducer and the chip-on-board substrate, wherein the perimeter of the ceramic buffer extends out beyond the perimeter of the constraint, and the ceramic buffer is bonded to the chip-on-board substrate in the portion of the ceramic buffer that extends out beyond the perimeter of the constraint; and
wherein said ceramic buffer includes a coefficient of thermal expansion that is between that of said constraint and said chip-on-board substrate.

12. The chip-on-board pressure sensor apparatus of claim 11, wherein the first major surface of the ceramic buffer is bonded to the second major surface of the constraint.

13. The chip-on-board pressure sensor apparatus of claim 12, wherein the second major surface of the ceramic buffer is bonded to the first major surface of the chip-on-board substrate.

14. The chip-on-board pressure sensor apparatus of claim 13, wherein the pressure transducer is situated adjacent to the first major surface of the chip-on-board substrate.

15. The chip-on-board pressure sensor apparatus of claim 11, wherein the ceramic buffer is adhesively bonded to the constraint of the pressure transducer and adhesively bonded to the chip-on-board substrate.

16. The chip-on-board pressure sensor apparatus of claim 11, wherein the ceramic buffer is bonded to the chip-on-board substrate using an eutectic metal solder.

17. The chip-on-board pressure sensor apparatus of claim 11, wherein the constraint includes glass and the pressure transducer die includes silicon, and the pressure transducer die is anodically bonded to the first major surface of the constraint.

18. The chip-on-board pressure sensor apparatus of claim 11, wherein the ceramic buffer is a multilayer structure having a plurality of cavities or buried channels.

19. A chip-on-board pressure sensor apparatus, comprising:

a chip-on-board substrate having a through-hole extending therethrough along an axis;

a pressure transducer, the pressure transducer having a maximum outer dimension;

a buffer including a ceramic material having a maximum outer dimension, the buffer interposed between and bonded to the pressure transducer and the chip-on-board substrate, the maximum outer dimension of the buffer being greater than the maximum outer dimension of the pressure transducer, such that the buffer extends out past the maximum outer dimension of the pressure transducer, and wherein the buffer is bonded to the chip-on-board substrate in the portion of the buffer that extends out past the pressure transducer; and the pressure transducer is positioned generally in line with the axis of the through-hole of the chip-on-board substrate.

20. The chip-on-board pressure sensor apparatus of claim 19, wherein said buffer includes a coefficient of thermal expansion that is between that of said pressure transducer and said chip-on-board substrate.

* * * * *